(12) United States Patent
Han et al.

(10) Patent No.: US 11,462,605 B2
(45) Date of Patent: Oct. 4, 2022

(54) DISPLAY APPARATUS

(71) Applicant: SAMSUNG DISPLAY CO., LTD., Yongin-si (KR)

(72) Inventors: Inyoung Han, Yongin-si (KR); Wonkyu Kwak, Yongin-si (KR); Yunkyeong In, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 233 days.

(21) Appl. No.: 16/984,980

(22) Filed: Aug. 4, 2020

(65) Prior Publication Data
US 2021/0043715 A1 Feb. 11, 2021

(30) Foreign Application Priority Data
Aug. 7, 2019 (KR) .................. 10-2019-0096332

(51) Int. Cl.
*H01L 27/32* (2006.01)
*H01L 51/52* (2006.01)
*G06F 3/044* (2006.01)

(52) U.S. Cl.
CPC ........ *H01L 27/3276* (2013.01); *G06F 3/0448* (2019.05); *H01L 27/323* (2013.01); *H01L 27/3246* (2013.01); *H01L 51/5253* (2013.01); *G06F 2203/04112* (2013.01); *H01L 2251/301* (2013.01)

(58) Field of Classification Search
CPC .............. H01L 27/3276; H01L 27/323; H01L 27/3246; H01L 51/5253; G06F 3/0448
See application file for complete search history.

(56) References Cited

U.S. PATENT DOCUMENTS

| | | | |
|---|---|---|---|
| 9,035,338 B2 | 5/2015 | Kang et al. | |
| 9,412,972 B2 | 8/2016 | Shim et al. | |
| 9,818,807 B2 | 11/2017 | Park | |
| 10,026,793 B2 | 7/2018 | Jeon | |
| 2018/0033830 A1 | 2/2018 | Kim et al. | |
| 2018/0059862 A1 | 3/2018 | Zeng et al. | |
| 2019/0081279 A1 | 3/2019 | Oh et al. | |

FOREIGN PATENT DOCUMENTS

| | | |
|---|---|---|
| KR | 10-2016-0032800 | 3/2016 |
| KR | 10-2016-0087982 | 7/2016 |
| KR | 10-2016-0124301 | 10/2016 |
| KR | 10-2018-0014398 | 2/2018 |
| KR | 10-1900362 | 11/2018 |

*Primary Examiner* — Sardis F Azongha
(74) *Attorney, Agent, or Firm* — F. Chau & Associates, LLC

(57) ABSTRACT

A display apparatus that includes a substrate comprising a display area and a non-display area on a periphery of the display area. A display device is on the display area. The display device comprises a light-emitting device electrically connected to a thin film transistor. A first barrier wall is on the non-display area. The first barrier wall surrounds the display area and comprises a first layer and a second layer. The first layer comprises a first portion having a first height from an upper surface of the substrate, and a second portion having a second height from the upper surface of the substrate that is less than the first height. The second layer is on the second portion.

20 Claims, 12 Drawing Sheets

DISPLAY APPARATUS

CROSS-REFERENCE TO RELATED APPLICATION

This application claims priority under 35 U.S.C. § 119 to Korean Patent Application No. 10-2019-0096332, filed on Aug. 7, 2019, in the Korean Intellectual Property Office, the disclosure of which is incorporated by reference in its entirety herein.

TECHNICAL FIELD

One or more embodiments relate to a display apparatus, and more particularly, to a display apparatus having improved reliability.

DISCUSSION OF RELATED ART

An organic light-emitting display apparatus has received great attention as a next-generation display apparatus due to its wide viewing angle, high contrast, and fast response speed.

In general, an organic light-emitting display apparatus includes thin film transistors and organic light-emitting diodes on a substrate. The organic light-emitting diodes emit light by themselves without requiring a backlight to provide an image in a display area of the display apparatus. An organic light-emitting display apparatus may be used as a display in electronic devices having relatively small displays, such as a mobile phone, or in electronic devices having relatively large displays, such as a television.

The display area of an organic light-emitting display apparatus includes pixels arranged thereon. A non-display area is disposed along a periphery of the display area. Since the non-display area of the organic light-emitting display apparatus is positioned along edges of a substrate, structures for preventing moisture infiltration from outside are arranged on the non-display area.

SUMMARY

However, in a display apparatus according to the related art, a thickness of a structure for preventing moisture infiltration from the outside is gradually reduced towards an outer portion of a panel. Therefore, display defects may occur.

One or more exemplary embodiments of the present inventive concepts include a display apparatus having improved reliability by arranging a structure for preventing moisture infiltration from the outside to have a constant thickness. However, the above technical features are exemplary and the scope of the disclosure is not limited thereto.

Additional aspects will be set forth in pert in the description which follows and, in part, will be apparent from the description, or may be learned by practice of the presented exemplary embodiments of the present inventive concepts.

According to an exemplary embodiment of the present inventive concepts, a display apparatus includes a substrate comprising a display area and a non-display area on a periphery of the display area. A display device is on the display area. The display device comprises a light-emitting device electrically connected to a thin film transistor. A first barrier wall is on the non-display area. The first barrier wall surrounds the display area and comprises a first layer and a second layer. The first layer comprises a first portion having a first height from an upper surface of the substrate, and a second portion having a second height from the upper surface of the substrate that is less than the first height. The second layer is on the second portion.

The display apparatus may further include a metal pattern layer above the substrate, the metal pattern layer at least partially corresponding to the first barrier wall.

The metal pattern layer may have an embossed structure.

The display device may further include a first planarization layer on the thin film transistor and a pixel defining layer on the first planarization layer. The first planarization layer may cover the thin film transistor and the pixel defining layer may include an opening that defines a light-emitting region of the light-emitting device. The first layer may include a same material as a material in the pixel defining layer.

The display device may further include a spacer on the pixel defining layer and the second layer may include a same material as a material in the spacer.

The display device may further include a storage capacitor including a lower electrode and an upper electrode that overlaps the lower electrode. The thin film transistor may include an active layer and a gate electrode, and the metal pattern layer may include a same material as a material in the upper electrode.

The lower electrode and the gate electrode may be integral with each other.

The first planarization layer may extend towards the non-display area.

The first barrier wall may be on the non-display area along a periphery of the display area and may at least partially overlap the first planarization layer.

The display apparatus may further include a second barrier wall arranged along a periphery of the display area, the second barrier wall being spaced apart from the first barrier wall, and a third barrier wall arranged along the periphery of the display area, the third barrier wall being spaced apart from the second barrier wall.

The first barrier wall may have a first width in a first direction and the second barrier wall may have a second width in the first direction, the second width being less than the first width.

The first barrier wall may have a third height from the upper surface of the substrate and the third barrier wall may have a fourth height from the upper surface of the substrate, the fourth height being greater than the third height.

In the second portion of the first barrier wall, an upper surface of the second layer may have a fifth height from the upper surface of the substrate, and the fifth height may be equal to or less than the first height.

The display apparatus may further include a thin film encapsulation layer between the display device and the first barrier wall.

The thin film encapsulation layer may include a first inorganic encapsulation layer, a second inorganic encapsulation layer above the first inorganic encapsulation layer, and an organic encapsulation layer between the first inorganic encapsulation layer and the second inorganic encapsulation layer.

The first inorganic encapsulation layer and the second inorganic encapsulation layer may be in contact with each other in a region between the first barrier wall and the second barrier wall.

The display apparatus may further include a touch unit directly on the second inorganic encapsulation layer. The touch unit may include a sensing electrode corresponding to the display area, and a signal line corresponding to the non-display area and being connected to the sensing electrode.

The sensing electrode may include a first conductive layer, a second conductive layer above the first conductive layer, a first touch insulating layer between the first conductive layer and the second conductive layer, and a second touch insulating layer on the second conductive layer.

The sensing electrode may have a mesh shape.

According to another exemplary embodiment of the present inventive concepts, a display apparatus includes a substrate comprising a display area and a non-display area on a periphery of the display area. A display device is on the display area. The display device comprises a light-emitting device electrically connected to a thin film transistor. A first barrier wall is on the non-display area along a periphery of the display area. The first barrier wall comprises a first layer and a second layer. The first layer comprises a first portion having a first height from an upper surface of the substrate and a second portion having a second height from the upper surface of the substrate that is less than the first height. The second layer is on the second portion. A metal pattern layer is above the substrate. The metal pattern layer at least partially overlaps the first barrier wall on the non-display area.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EXEMPLARY EMBODIMENTS

Figure 1:
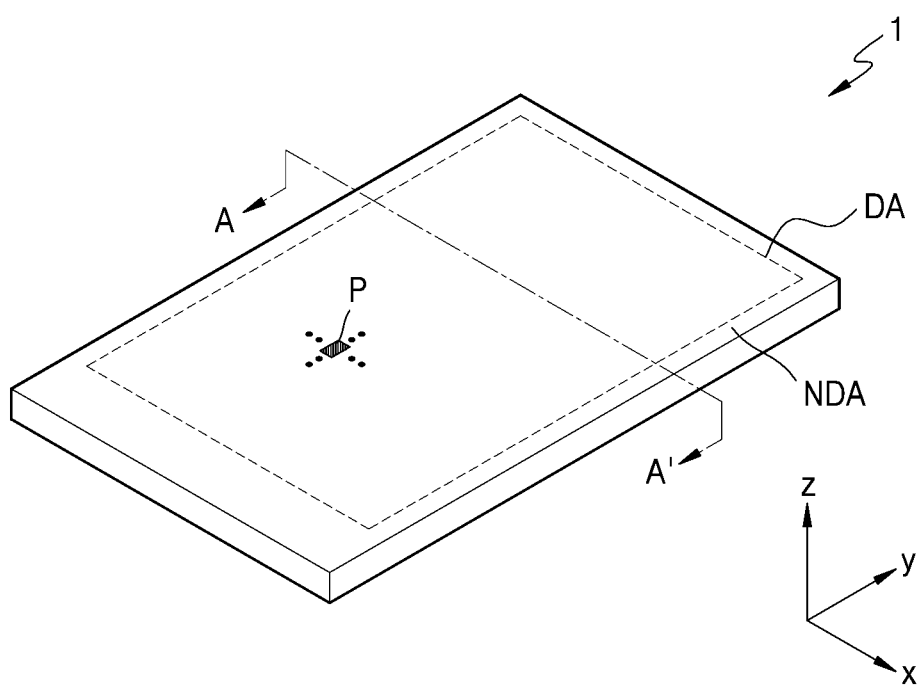
FIG. 1 is a perspective view of a display apparatus according to an exemplary embodiment of the present inventive concepts.

Reference will now be made in detail to exemplary embodiments of the present inventive concepts, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments of the present inventive concepts are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The exemplary embodiments of the present inventive concepts will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another. An expression used in the singular encompasses the expression of the plural, unless it has a clearly different meaning in the context.

It will be further understood that the terms "comprises" and or "comprising" used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following exemplary embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain exemplary embodiment may be implemented differently, a specific process order may be performed differently from the described order. For example, two consecutively described processes may be performed substantially at the same time or performed in an order opposite to the described order.

FIG. 1 is a perspective view of a display apparatus 1 according to an exemplary embodiment.

Referring to FIG. 1, the display apparatus 1 includes a display area DA and a non-display area NDA. The display apparatus 1 displays images in the display area DA. The display apparatus 1 may provide images by using light emitted from a plurality of pixels P arranged in the display area DA. The display apparatus does not display images in the non-display area NDA.

Hereinafter, a display apparatus 1 according to an exemplary embodiment is described as an organic light-emitting display apparatus. However, the display apparatus 1 of exemplary embodiments of the present inventive concept are not limited thereto. In another exemplary embodiment, the display apparatus 1 may include another type of light-emitting device, such as an inorganic light-emitting display, an inorganic electroluminescence (EL) display apparatus, a quantum dot light-emitting display apparatus, etc. For example, a light-emitting layer of a display element included in the display apparatus 1 may include an organic material, an inorganic material, quantum dots, an organic material and quantum dots, or an inorganic material and quantum dots.

FIG. 1 shows the display apparatus 1 having a flat display surface. However, exemplary embodiments of the present inventive concepts are not limited thereto. For example, in another exemplary embodiment, the display apparatus 1 may include a three-dimensional display surface or a curved display surface.

In embodiments in which the display apparatus 1 includes the three-dimensional display surface, the display apparatus 1 includes a plurality of display areas oriented differently from one another, such as a polyprism-type display surface. In another exemplary embodiment in which the display apparatus 1 includes a curved display surface, the display apparatus 1 may be implemented in various types, such as a flexible display apparatus, a foldable display apparatus, a rollable display apparatus, etc.

In the exemplary embodiment of FIG. 1, the display apparatus 1 may be applied to a mobile device, such as a mobile phone or tablet. The mobile device may be configured by including electronic modules, a camera module, a power module, etc. mounted on a main board that is arranged in a bracket/case together with the display apparatus 1. The display apparatus 1 according to an exemplary embodiment may also be applied to an electronic apparatus that has a relatively large display, such as a television, a monitor, etc., and an electronic apparatus that has a small-medium size display, such as a tablet, a car navigation system, a game console, a smart watch, etc.

In FIG. 1, the display area DA of the display apparatus 1 has a square shape. However, exemplary embodiments of the present inventive concepts are not limited thereto. For example, in another exemplary embodiment, the display area DA may have a circular shape, an elliptical shape, or a polygonal shape, such as a triangular shape, a pentagonal shape, etc.

Figure 2:
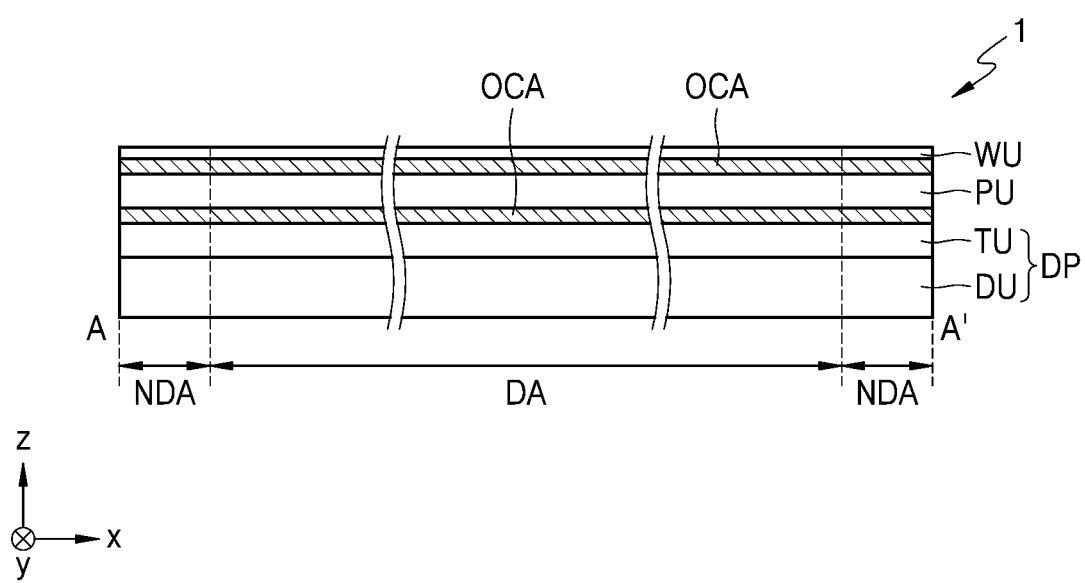
FIG. 2 is a cross-sectional view of the display apparatus taken along line A-A' of FIG. 1 according to an exemplary embodiment of the present inventive concepts.

FIG. 2 is a cross-sectional view of the display apparatus 1 taken along line A-A' of FIG. 1 FIG. 2 is a simplified view for describing stacking relations among functional panels and/or functional units included in the display apparatus 1.

As shown in the exemplary embodiment of FIG. 2, the display apparatus 1 may include a display unit DU (e.g., a display layer), a touch unit TU, a polarization unit PU, and a window unit WU stacked on each other (e.g., in the Z direction). At least some elements of the display unit DU, the touch unit TU, the polarization unit PU, and the window unit WU may be manufactured through successive processes or at least some elements may be coupled to one another via an adhesive member. FIG. 2 shows an optical clear adhesive (OCA) as an example of the adhesive member. The adhesive member described below may include a general adhesive. In an exemplary embodiment, the polarization unit PU and the window unit WU may be replaced with another element or may be omitted.

The touch unit TU may be disposed directly on the display unit DU. For example, a bottom surface of the touch unit TU may be disposed directly on a top surface of the display unit DU in the Z direction. In the specification, the phrase "element B is directly on element A" denotes that an additional adhesive layer/adhesive member is not arranged between the element A and the element B. The element B is formed on a base surface provided by the element A through a successive process after forming the element A.

The display unit DU and the touch unit TU directly on the display unit DU may be defined as a display panel DP. As shown in the exemplary embodiment of FIG. 2, the OCA may be between the display panel DP and the polarization unit PU and between the polarization unit PU and the window unit WU.

The display unit DU generates images and the touch unit TU obtains coordinate information of an external input (e.g., a touch event such as a touch by the user's finger). The display panel DP according to an exemplary embodiment may further include a protective member on a lower surface of the display unit DU. The protective member and the display unit DU may be bonded to each other via an adhesive member.

The display unit DU according to an exemplary embodiment may be a light-emitting display panel. However, exemplary embodiments of the present inventive concepts are not limited thereto. For example, the display unit DU may include an organic light-emitting display panel or a quantum-dot light-emitting display panel. An emission layer of the organic light-emitting display panel may include an organic light-emitting material. An emission layer of the quantum-dot light-emitting display panel may include quantum dots and quantum rods. Hereinafter, for convenience of explanation, it will be assumed that the display unit DU includes an organic light-emitting display panel.

The polarization unit PU reduces a reflectivity of external light incident from an upper portion of the window unit WU. In an exemplary embodiment of the present inventive concepts, the polarization unit PU may include a retarder and a polarizer. The retarder may be of a film type or a liquid crystal coating type, and may include a λ/2 retarder and/or a λ/4 retarder. The polarizer may be of a film type or a liquid crystal coating type. The film type polarizer may include a stretched synthetic resin film, and the liquid crystal coating type polarizer may include liquid crystals arranged in a certain orientation. The retarder and the polarizer may further include a protective film. The retarder and the polarizer themselves or the protective films may be defined as a base layer of the polarization unit PU.

Hereinafter, structures of the display unit DU and the touch unit TU will be described in detail below.

Figure 3:
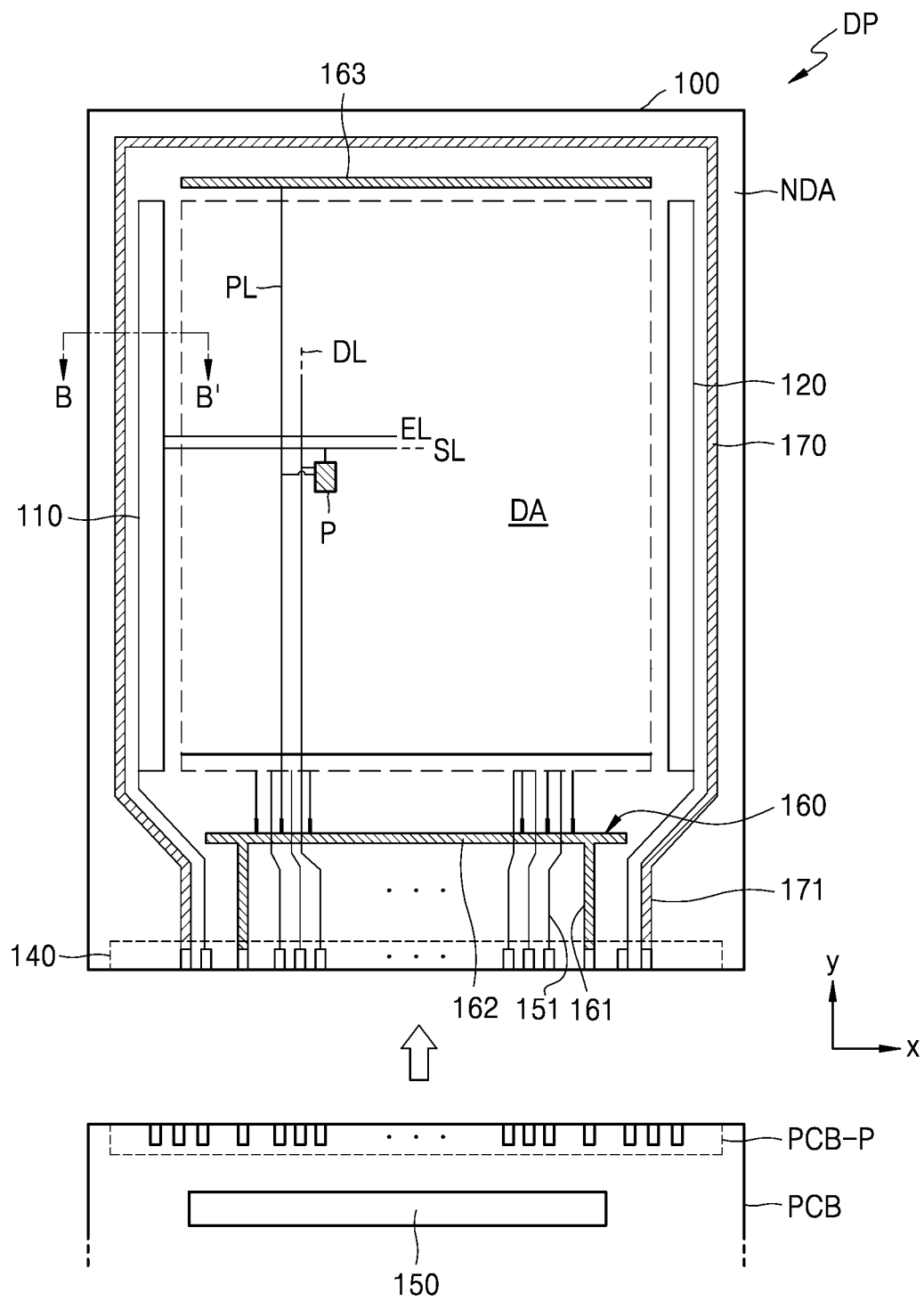
FIG. 3 is a top plan view showing a portion of a display apparatus according to an exemplary embodiment of the present inventive concepts.

FIG. 3 is a top plan view showing a portion of the display apparatus 1 according to an exemplary embodiment of the present inventive concepts.

Figure 5:
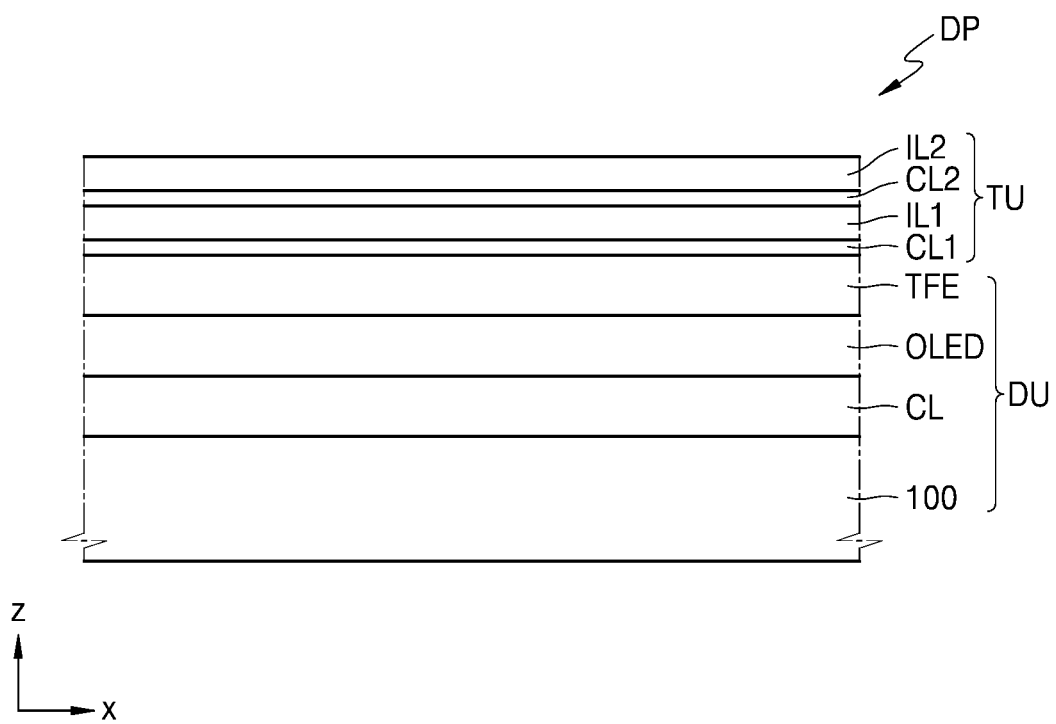
FIG. 5 is a cross-sectional view showing a portion of a display apparatus according to an exemplary embodiment of the present inventive concepts.

Referring to FIG. 3, the display panel DP includes a plurality of pixels P on the display area DA. Each of the plurality of pixels P may include a display element such as an organic light-emitting diode. Each of the pixels P may emit light, such as red light, green light, blue light, or white light, via the organic light-emitting diode. However, exemplary embodiments of the present inventive concepts are not limited thereto. The display area DA is covered by a thin film encapsulation layer (TFE), as shown in FIG. 5 for protection against external air or moisture.

Each of the pixels P may be electrically connected to external pixels arranged in the non-display area NDA. The non-display area NDA may include a first scan driving circuit 110, a second scan driving circuit 120, a pad portion 140, a data driving circuit 150, a first power supply line 160, and a second power supply line 170.

The first scan driving circuit 110 may provide each pixel P with a scan signal via a scan line SL. The first scan driving circuit 110 may provide each of the pixels P with an emission control signal via an emission control line EL. The second scan driving circuit 120 may be arranged in parallel with the first scan driving circuit 110, as the display area DA is arranged therebetween. For example, as shown in the exemplary embodiment of FIG. 3, the first scan thriving circuit 110 and the second scan driving circuit 120 may be arranged on a left side portion and right side portion (e.g., in the X direction) of the non-display area NDA and are spaced apart in the X direction with the display area positioned therebetween. A first portion of the pixels P arranged in the display area DA may be electrically connected to the first scan driving circuit 110, and a second portion comprising the remaining pixels other than the first portion may be connected to the second scan driving circuit 120. However, in other exemplary embodiments, the display panel DP may include only the first scan driving circuit 110.

The pad portion 140 may be arranged at a side of the substrate 100. For example, as shown in the exemplary embodiment of FIG. 3, the pad portion 140 may be disposed on a bottom side (e.g., in the Y direction) of the non-display area NDA. In an exemplary embodiment, the pad portion 140 is exposed and is not covered by an insulating layer. The pad portion 140 may be electrically connected to a printed circuit board PCB. A pad portion PCB-P of the printed circuit board PCB may be electrically connected to the pad portion 140 of the display apparatus 1. The printed circuit board PCB may transfer a signal or power from a controller to the display apparatus 1.

A control signal generated by the controller may be respectively transferred to the first and second scan driving circuits 110 and 120 via the printed circuit board PCB. The controller may provide the first and second power supply lines 160 and 170 respectively with a first power voltage ELVDD and a second power voltage ELVSS (see FIG. 4) via first and second connecting lines 161 and 171. The first power voltage ELVDD is supplied to each pixel P via a driving voltage line PL connected to the first power supply line 160. The second power voltage ELVSS may be provided to an opposite electrode of each pixel P connected to the second power supply line 170.

The data driving circuit 150 is electrically connected to a data line DL. A data signal of the data driving circuit 150 may be provided to each of the pixels P via a connecting line 151 connected to the pad portion 140 and a data line DL connected to the connecting line 151. Although FIG. 3 shows that the data driving circuit 150 is arranged on the printed circuit board PCB, in another exemplary embodiment the data driving circuit 150 may be arranged on the substrate 100. For example, the data driving circuit 150 may be disposed on the substrate 100 between the pad portion 140 and the first power supply line 160 (e.g., in the Y direction).

The first power supply line 160 may include a first sub-line 162 and a second sub-line 163 that extend in parallel with each other in the X direction with the display area DA interposed therebetween. For example, as shown in the exemplary embodiment of FIG. 3, the first sub-line 162 and second sub-line 163 may be disposed on a top side and bottom side (e.g., in the Y direction), respectively, of the non-display area NDA. The driving voltage line PL may extend between the first sub-line 162 and the second sub-line 163. The second power supply line 170 has a loop shape having an open side and may partially surround the display area DA.

Figure 4:
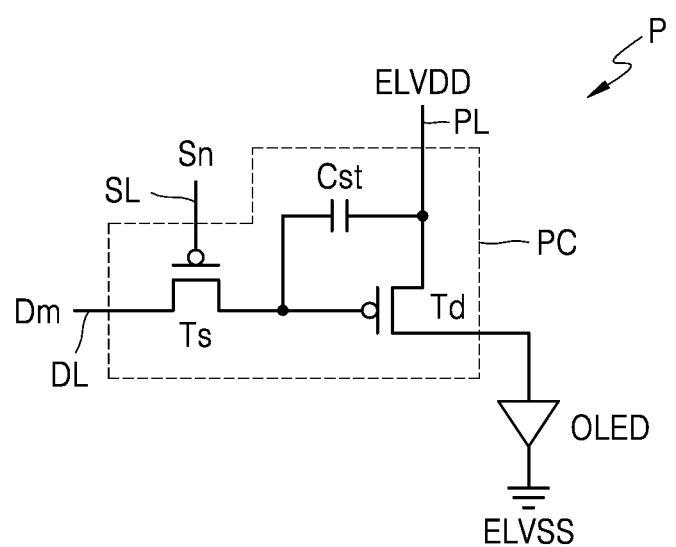
FIG. 4 is an equivalent circuit diagram of a pixel included in a display apparatus according to an exemplary embodiment of the present inventive concepts.

FIG. 4 is an equivalent circuit diagram of a pixel included in a display apparatus according to an exemplary embodiment of the present inventive concepts.

Referring to FIG. 4, each pixel P includes a pixel circuit PC connected to a scan line SL and a data line DL, and an organic light-emitting diode OLED connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL and transfers a data signal Dm input through the data line DL to the driving thin film transistor Td according to a scan signal Sn input through the scan line SL.

The storage capacitor Cst is connected to the switching thin film transistor Ts and a driving voltage line PL and stores a voltage corresponding to a difference between a voltage transferred from the switching thin film transistor Ts and the first power voltage ELVDD (or driving voltage) supplied to the driving voltage line PL.

The driving thin film transistor Td is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a certain luminance according to the driving current.

FIG. 4 shows an exemplary embodiment in which the pixel circuit PC includes two thin film transistors and one storage capacitor. However, exemplary embodiments of the present inventive concepts are not limited thereto. For example, in an exemplary embodiment, the pixel circuit PC may include seven thin film transistors and one storage capacitor. In another exemplary embodiment, the pixel circuit PC may include two or more storage capacitors. Furthermore, the thin film transistors shown include a single gate electrode. However, in other exemplary embodiments, one or more thin film transistors may include a double gate electrode structure, etc.

FIG. 5 is a cross-sectional view showing a portion of a display apparatus according to an exemplary embodiment of the present inventive concepts.

Referring to FIG. 5, the display panel DP includes the display unit DU and the touch unit TU. The display unit DU shown in the exemplary embodiment of FIG. 5 is simplified for convenience of description of the stacking relation of the touch unit TU. The touch unit TU may further include the polarization unit PU (see FIG. 2) and the window unit WU (see FIG. 2) arranged on the touch unit TU. However, exemplary embodiments of the present inventive concepts are not limited thereto.

Figure 7:
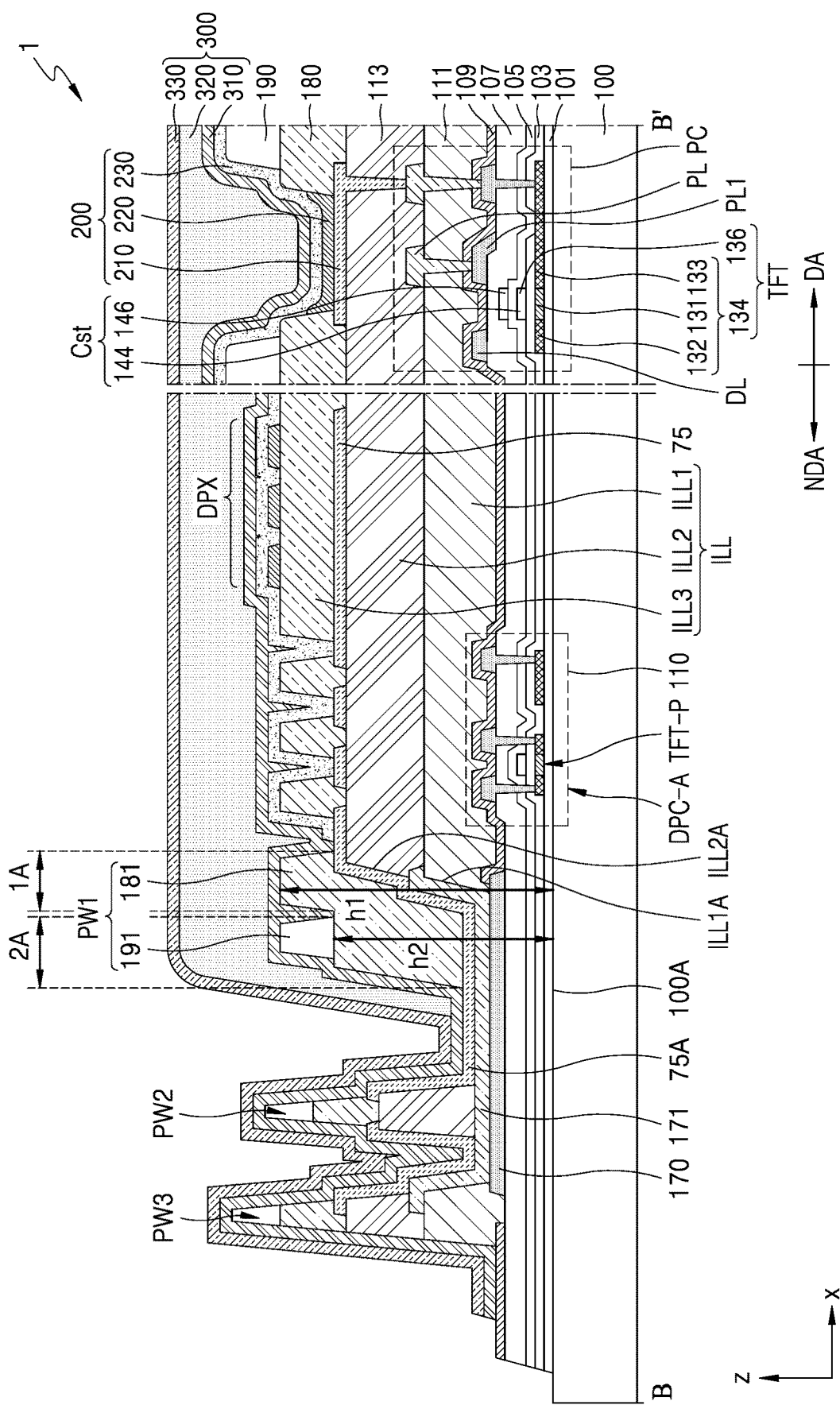
FIG. 7 is a cross-sectional view showing a portion of a display apparatus taken along line B-B' of FIG. 3 according to an exemplary embodiment of the present inventive concepts.

The display unit DU may include a circuit layer CL, the organic light-emitting diode OLED, and the thin film encapsulation layer TFE that are sequentially arranged on a substrate 100 (e.g., in the Z direction). A bottom surface of the thin film encapsulation layer TFE may be disposed directly on a top surface of the organic light-emitting diode OLED (e.g., in the Z direction). The touch unit TU may be disposed directly on the thin film encapsulation layer TFE. For example, a bottom surface of the touch unit TU may directly contact a top surface of the thin film encapsulation layer TFE (e.g., in the Z direction). The thin film encapsulation layer TFE includes at least one organic encapsulation layer 320 as shown in FIG. 7 that will be described later. Therefore, the thin film encapsulation layer TFE may provide a planarized base surface which the touch unit TU is disposed thereon. Therefore, even when elements of the touch unit TU that will be described later are formed by successive processes, a defective rate may be reduced.

The touch unit TU may have a multi-layered structure. The touch unit TU may include a sensing electrode, a trace line connected to the sensing electrode, and at least one touch insulating layer. The touch unit TU may sense am external input. For example, in an exemplary embodiment, the touch unit TU may sense an external input in a capacitive manner. However, exemplary embodiments of the present inventive concepts are not limited thereto and the touch unit TU may sense the external input by an electromagnetic induction method, a pressure sensing method, etc.

In the exemplary embodiment shown in FIG. 5, the touch unit TU may include a first conductive layer CL1, a first touch insulating layer IL1, a second conductive layer CL2, and a second touch insulating layer IL2. Each of the first conductive layer CL1 and the second conductive layer CL2 may have a single-layered or a multi-layered structure. The conductive layer of a single-layered structure may include a metal layer or a transparent conductive layer. The metal layer may include molybdenum, silver, titanium, copper, aluminum, and alloys thereof. The transparent conductive layer may include a transparent conductive oxide material such as indium tin oxide (ITO), indium zinc oxide (IZO), zinc oxide (ZnO), indium tin zinc oxide (ITZO), etc. However, exemplary embodiments of the present inventive concepts are not limited thereto. In addition, the transparent conductive layer may include a conductive polymer such as poly(3,4-ethylenedioxythiophene) PEDOT, metal nanowires, graphene, etc. However, exemplary embodiments of the present inventive concepts are not limited thereto.

The conductive layer of a multi-layered structure may include multiple metal layers. The multiple metal layers may have, for example, a triple-layered structure of Ti/Al/Ti. The conductive layer of the multi-layered structure may include at least one metal layer and at least one transparent conductive layer.

Each of the first conductive layer CL1 and the second conductive layer CL2 includes a plurality of patterns. Hereinafter, it will be understood that the first conductive layer CL1 includes first conductive patterns and the second conductive layer CL2 includes second conductive patterns. Each of the first conductive patterns and the second conductive patterns may include sensing electrodes and signal lines that will be described later with reference to FIG. 6.

A stack structure and a material of the sensing electrode may be determined taking into account a sensitivity. A resistive-capacitive (RC) delay may affect the sensitivity, and sensing electrodes including the metal layer have less resistance as compared with the transparent conductive layer, and thus an RC value is reduced. Therefore, a time taken to charge a capacitor defined between the sensing electrodes may be reduced. The sensing electrodes including the transparent conductive layers are not visible by a user as compared with electrodes including the metal layer, and an input area is increased to increase a capacitance.

The sensing electrode including the metal layers may have a mesh shape as described later with reference to FIG. 6 to prevent visibility of the sensing electrodes to the user.

Each of the first touch insulating layer IL1 and the second touch insulating layer IL2 may have a single-layered or multi-layered structure. Each of the first touch insulating layer IL1 and the second touch insulating layer IL2 may include at least one selected from an inorganic material, an organic material, or a composite material.

In an alternative exemplary embodiment, at least one of the first touch insulating layer IL1 and the second touch insulating layer IL2 may include an inorganic layer. In an exemplary embodiment, the inorganic layer may include at least one of aluminum oxide, titanium oxide, silicon oxide, silicon oxynitride, zirconium oxide, and hafnium oxide. However, exemplary embodiments of the present inventive concepts are not limited thereto.

In an alternative exemplary embodiment, at least one selected from the first touch insulating layer IL1 and the second touch insulating layer IL2 may include an organic layer. In an exemplary embodiment, the organic layer may include at least one selected from an acryl-based resin, a methacryl-based resin, polyisoprene, a vinyl-based resin, an epoxy-based resin, an urethane-based resin, a cellulose-based resin, a siloxane-based resin, a polyimide-based resin, a polyamide-based resin, and a perylene-based resin. However, exemplary embodiments of the present inventive concepts are not limited thereto.

Figure 6:
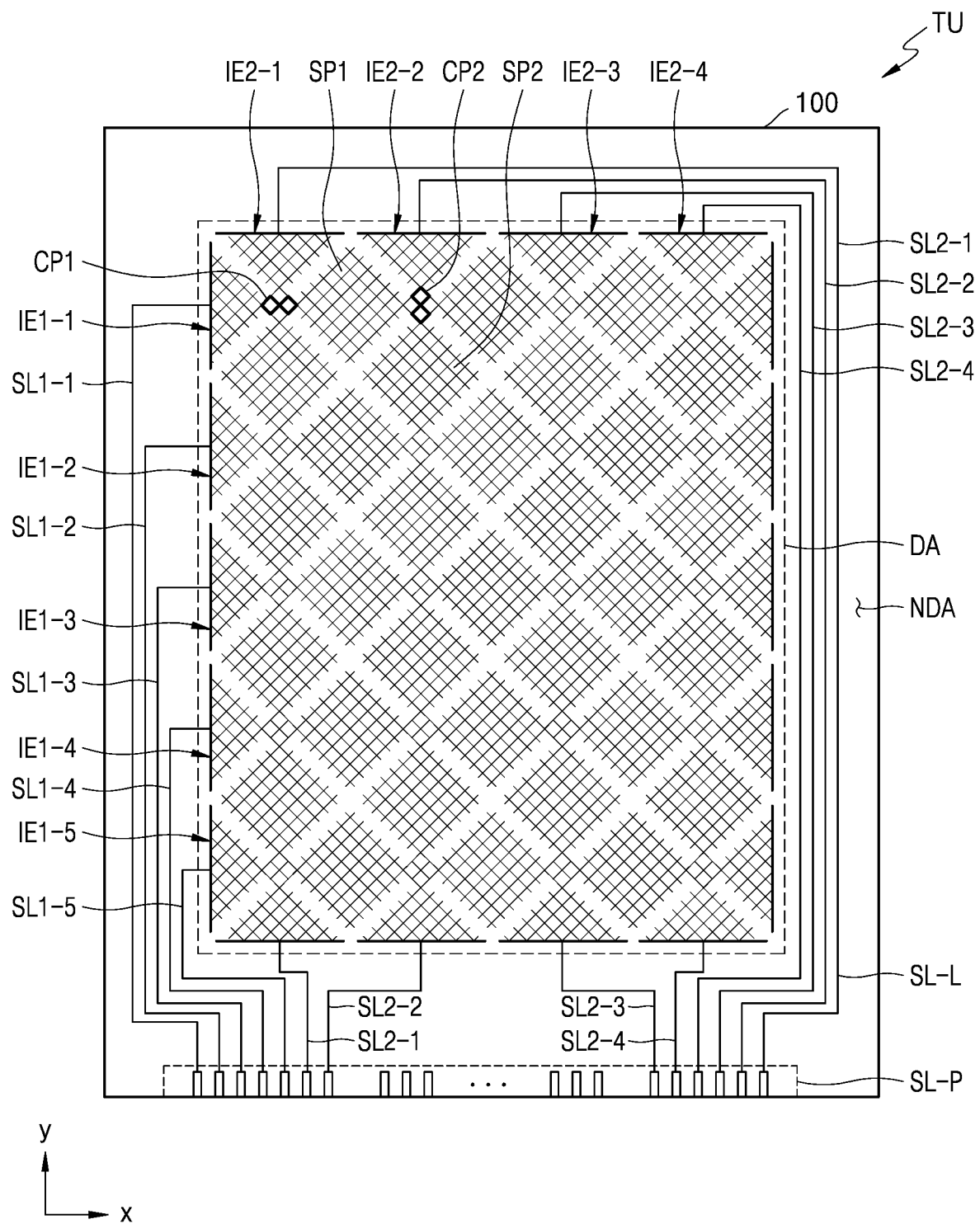
FIG. 6 is a top plan view of a touch unit in a display apparatus according to an exemplary embodiment of the present inventive concepts.

FIG. 6 is a top plan view of a touch unit TV in a display apparatus according to an exemplary embodiment of the present inventive concepts.

Referring to FIG. 6, the touch unit TU may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4.

In an exemplary embodiment, the first sensing electrodes IE1-1 to IE1-5 of the touch unit TU are formed from the first conductive layer CL1 (see FIG. 5) and the second sensing electrodes IE2-1 to IE2-4 are formed from the second conductive layer CL2 (see FIG. 5). In the exemplary embodiment of FIG. 6, the first sensing electrodes IE1-1 to IE1-5 and the second sensing electrodes IE2-1 to IE2-4 each have a mesh shape. In an exemplary embodiment, the first sensing electrodes IE1-1 to IE1-5 and the second sensing electrodes IE2-1 to IE2-4 may have a triple-layered structure including Ti/Al/Ti.

In an exemplary embodiment, the touch unit TU may further include an optical dummy electrode arranged in a boundary region between the first sensing electrodes IE1-1 to IE1-5 and the second sensing electrodes IE2-1 to IE2-4. In this regard, the touch unit TU may further include first dummy electrodes formed from the first conductive layer CL1 and second dummy electrodes formed from the second conductive layer CL2.

The first dummy electrodes are connected to second sensors SP2 of the second sensing electrodes IE2-1 to IE2-4 via contact holes. The second dummy electrodes may be connected to first sensors SP1 of the first sensing electrodes IE1-1 to IE1-5 via the contact holes. The first dummy electrodes and the second dummy electrodes may reduce the resistance of the first sensing electrodes IE1-1 to IE1-5 and the second sensing electrodes IE2-1 to IE2-4.

Each of the first sensing electrodes IE1-1 to IE1-5 includes the first sensors SP1 and first connecting portions CP1. Each of the second sensing electrodes IE2-1 to IE2-4 includes the second sensors SP2 and second connecting portions CP2. From among the first sensors SP1, two first sensors at opposite ends of the first sensing electrode may have smaller sizes than those of the first sensors located at the center. For example, as shown in the exemplary embodiment of FIG. 6, two first sensors at a left edge and right edge of the first sensing electrodes (e.g., in the X direction) may be approximately half the size of the first sensor at the center. From among the second sensors SP2, two second sensors at opposite ends of the second sensing electrode may have smaller sizes than those of the second sensors located at the center. For example, as shown in the exemplary embodiment of FIG. 6, two second sensors SP2 at a top edge and a bottom edge of the second sensing electrodes may be approximately half the size of the second sensor at the center. However, exemplary embodiments of the present inventive concepts are not limited thereto.

In FIG. 6, the first sensing electrodes IE1-1 to IE1-5 and the second sensing electrodes IE2-1 to IE2-4 have a certain pattern. However, exemplary embodiments of the present inventive concepts are not limited thereto and the first sensing electrodes and second sensing electrodes may have a variety of different patterns and arrangements. In the exemplary embodiment shown in FIG. 6, the first sensors SP1 and the second sensors SP2 each having a rhombus (e.g., diamond) shape. However, exemplary embodiments of the present inventive concepts are not limited thereto. For example in other exemplary embodiments, each of the first sensors SP1 and the second sensors SP2 may have another polygonal shape. In another exemplary embodiment, the first sensing electrodes IE1-1 to IE1-5 and the second sensing electrodes IE2-1 to IE2-4 may each have a shape, in which the sensors and the connecting portions are not distinguishable from each other, (e.g., a bar shape).

In one first sensing electrode, a plurality of the first sensors SP1 are arranged (e.g., spaced apart) in an X-direction. In one second sensing electrode, a plurality of the second sensors SP2 are arranged (e.g., spaced apart) in a Y-direction. The first connecting portions CP1 are positioned between adjacent first sensors SP1 (e.g., in the X direction) and connect the adjacent first sensors to each other. The second connecting portions CP2 are positioned between adjacent second sensors SP2 (e.g., in the Y direction) and connect adjacent second sensors SP2 to each other.

The first signal lines SL1-1 to SL1-5 are respectively connected to ends of the first sensing electrodes IE1-1 to IE1-5. For example, as shown in the exemplary embodiment of FIG. 6, the first signal lines SL1-1 to SL1-5 are connected to ends of the first sensing electrodes IE1-1 to IE1-5 on a left edge portion (e.g., in the X direction) of the first sensing electrodes. The second signal lines SL2-1 to SL2-4 are connected to ends of the second sensing electrodes IE2-1 to IE2-4. For example, as shown in the exemplary embodiment of FIG. 6, the second signal lines SL2-1 to SL2-4 are connected to ends of the second sensing electrodes IE2-1 to IE2-4 at a top edge (e.g., in the Y direction) of the second sensing electrodes. However, exemplary embodiments of the present inventive concepts are not limited thereto and the connection of the first signal lines to the first sensing electrodes and the second signal lines to the second sensing electrodes may have a variety of different arrangements.

The first signal lines SL1-1 to SL1-5 and the second signal lines SL2-1 to SL2-4 may include a line portion SL-L and a pad portion SL-P. The line portion SL-L extends (e.g., in the X and Y directions) to contact the first sensing electrodes and second sensing electrodes. The pad portion SL-P is positioned within the pad portion 140.

In the present exemplary embodiment, each of the first sensing electrodes IE1-1 to IE1-5 and each of the second sensing electrodes IE2-1 to IE2-4 may have mesh shapes. Since the first sensing electrodes IE1-1 to IE1-5 and the second sensing electrodes IE2-1 to IE2-4 have the mesh shapes, parasitic capacitances with respect to the electrodes (e.g., opposite electrodes) in the display unit DU (see FIG. 5) may be reduced. Also, as described later, the First sensing electrodes IE1-1 to IE1-5 and the second sensing electrodes IE2-1 to IE2-4 do not overlap in light-emitting regions, and thus, they are not visible by a user of the display apparatus 1.

In an exemplary embodiment, the first sensing electrodes IE1-1 to IE1-5 and the second sensing electrodes IE2-1 to IE2-4 of the mesh shapes may include silver, aluminum, copper, chrome, nickel, titanium, etc. that may be processed at a low temperature. However, exemplary embodiments of the present inventive concepts are not limited thereto. Even in embodiments in which an input sensing unit (ISU) is formed through successive processes, damage to the organic light-emitting diode OLED may be prevented.

FIG. 7 is a cross-sectional view showing a portion of the display apparatus 1 according to an exemplary embodiment of the present inventive concepts. FIG. 7 show a cross-section of the display apparatus 1 taken along line B-B' of FIG. 3 according to an exemplary embodiment of the present inventive concepts.

As shown in the exemplary embodiment of FIG. 7, the display apparatus 1 includes the substrate 100 including the display area DA and the non-display area NDA. Display elements are disposed on the display area DA. A first barrier wall PW1 is disposed on the non-display area NDA (e.g., in a portion of the non-display area surrounding the display area DA). The first barrier wall PW1 includes a first layer 181 and a second layer 191.

In an exemplary embodiment, the substrate 100 may include glass or a polymer resin. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, etc. However, exemplary embodiments of the present inventive concepts are not limited thereto. The substrate 100 including the polymer resin may be flexible, rollable, or bendable. The substrate 100 may have a multi-layered structure including a layer including the polymer resin and an inorganic layer.

A buffer layer 101 is located on the substrate 100 to reduce or block infiltration of impurities, moisture, or external air from a lower portion of the substrate 100, and to provide a flat surface on the substrate 100. For example, as shown in the exemplary embodiment of FIG. 7, a bottom surface of the buffer layer 101 may be disposed on a top surface of the substrate 100 (e.g., in the Z direction). The buffer layer 101 may include an inorganic material such as an oxide material or a nitride material, an organic material, or an inorganic-organic composite material, and may have a single-layered or multi-layered structure including the inorganic material and the organic material. However, exemplary embodiments of the present inventive concepts are not limited thereto. A barrier layer for preventing infiltration of external air may be further provided between the substrate 100 and the buffer layer 101.

A thin film transistor TFT and a storage capacitor Cst may be disposed in the display area DA of the substrate. An organic light-emitting diode OLED that is a light-emitting device 200, is electrically connected to the thin film transistor TFT and the storage capacitor Cst.

In an exemplary embodiment, the thin film transistor TFT shown in FIG. 7 may correspond to one of the thin film transistors included in the pixel circuit PC shown in FIG. 4, such as a driving thin film transistor T1.

The thin film transistor TFT may include an active layer 134 and a gate electrode 136. The active layer 134 may include, for example, polysilicon. However, exemplary embodiments of the present inventive concepts are not limited thereto. The active layer 134 includes a channel region 131 overlapping with the gate electrode 136 (e.g., in the Z direction), and a source region 132 and a drain region 133 arranged at opposite sides of the channel region 131 (e.g., in the X direction) The source region 132 and the drain region 133 include impurities of higher concentration than that of the channel region 131. The impurities may include N-type impurities or P-type impurities. The source region 132 and the drain region 133 may be a source electrode and a drain electrode of the thin film transistor TFT.

The active layer 134 may include an oxide semiconductor and/or silicon semiconductor. In exemplary embodiments in which the active layer 134 includes an oxide semiconductor, the semiconductor layer may include an oxide of at least one material selected from the group consisting of indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the active layer 134 may include ITZO (InSnZnO), IGZO (InGaZnO), etc. In an exemplary embodiment in which the active layer 134 incudes silicon semiconductor, the semiconductor layer may include, for example, amorphous silicon (a-Si) or low temperature poly-silicon (LPTS) obtained by crystallizing a-Si. However, exemplary embodiments of the present inventive concepts are not limited thereto.

The gate electrode 136 may have a single or multi-layered structure including one or more metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). However, exemplary embodiments of the present inventive concepts ire not limited thereto. The gate electrode 136 may be connected to a gate line that applies an electrical signal to the gate electrode 136.

A gate insulating layer 103 may be arranged between the active layer 134 and the gate electrode 136 (e.g., in the Z direction). The gale insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The gate insulating layer 103 may have a single-layered or a multi-layered structure including the inorganic insulating material. However, exemplary embodiments of the present inventive concepts are not limited thereto.

The storage capacitor Cst may include a lower electrode 144 and an upper electrode 146 that overlap each other (e.g., in the Z direction). A first interlayer insulating layer 105 may be arranged between the lower electrode 144 and the upper electrode 146 of the capacitor Cst (e.g., in the Z direction). The first interlayer insulating layer 105 has a certain permittivity and may include an inorganic insulating layer such as SiON, $SiO_x$, and/or $SiN_x$ in a single-layered or multi-layered structure. However, exemplary embodiments of the present inventive concepts are not limited thereto.

In FIG. 7, the storage capacitor Cst that overlaps the thin film transistor TFT and the lower electrode 144 is integrally provided with the gate electrode 136 of the thin film transistor TFT. However, in another exemplary embodiment, the storage capacitor Cst may not overlap the thin film transistor TFT and the lower electrode 144 may be an independent element separate from the gate electrode 136 of the thin film transistor TFT.

A second inter layer insulating layer 107 may be disposed on the storage capacitor Cst. For example, a bottom surface of the second interlayer insulating layer 107 may be disposed directly on a top surface of the storage capacitor (e.g., in the Z direction). The second interlayer insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), etc., and may have a single-layered or multi-layered structure. However, exemplary embodiments of the present inventive concepts are not limited thereto.

A first planarization layer 111 and a second planarization layer 113 may be disposed on the second interlayer insulating layer 107. For example, a bottom surface of the first planarization layer 111 may be disposed on a top surface of the second interlayer insulating layer 107 (e.g., in the Z direction). A bottom surface of the second planarization layer 113 is disposed on a top surface of the first planarization layer 111 (e.g., in the Z direction) The first planarization layer 111 and the second planarization layer 113 planarize an upper surface of the pixel circuit PC. Therefore, the surface on which the organic light-emitting diode OLED is to be placed may be planarized. However, exemplary embodiments of the present inventive concepts are not limited thereto and in some exemplary embodiments, the number of planarization layers may vary.

In an exemplary embodiment, the first and second planarization layers 111 and 113 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. However, exemplary embodiments of the present inventive concepts are not limited thereto. The first and second planarization layers 111 and 113 may include an inorganic material. The first and second planarization layers 111 and 113 may include an insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In exemplary embodiments in which the first and second planarization layers 111 and 113 include an inorganic material, a chemical planarization polishing may be performed if necessary. However, in other exemplary embodiments, the first planarization layer 111 and the second planarization layer 113 may include both an organic material and an inorganic material.

The driving voltage line PL may be disposed on the first planarization layer 111. The driving voltage line PL may include aluminum (Al), copper (Cu), titanium (Ti), etc. and may have a single-layered or multi-layered structure. As an embodiment, the driving voltage line PL may have a multi-layered structure including Ti/Al/Ti. However, exemplary embodiments of the present inventive concepts are not limited thereto.

In FIG. 7, a lower driving voltage line PL1 is further provided under the first planarization layer 111. The lower driving voltage line PL1 is electrically connected to the driving voltage line PL via a contact hole penetrating through the first planarization layer 111 and a protective layer 109. The lower driving voltage line PL1 may prevent a voltage drop of the driving voltage ELVDD provided through the driving voltage line PL.

The lower driving voltage line PL1 may include a material that is the same as the material included in the data line DL. For example, the lower driving voltage line PL1 and the data line DL may include Al, Cu, Ti, etc. and may have a single-layered or multi-layered structure. In an exemplary embodiment, the lower driving voltage line PL1 and the data line DL may have a multi-layered structure including Ti/Al/Ti or TiN/Al/Ti. However, exemplary embodiments of the present inventive concepts are not limited thereto.

In an exemplary embodiment, the lower driving voltage line PL1 and the data line DL may be covered by the protective layer 109. The protective layer 109 may prevent wirings including metal such as aluminum, which may be damaged by an etchant, from being exposed to an etching environment during processes of manufacturing the display apparatus 1. In an exemplary embodiment, the protective layer 109 may extend to the non-display area NDA. However, in some exemplary embodiments, the protective layer 109 may be omitted.

In the display area DA of the substrate 100, the light-emitting device 200, such as the organic light-emitting diode OLED, may be disposed on the second planarization layer 113. The organic light-emitting diode OLED includes a pixel electrode 210, an intermediate layer 220, and an opposite electrode 230 facing the pixel electrode 210 with the intermediate layer 220 interposed therebetween (e.g., in the Z direction).

The pixel electrode 210 may be disposed on the second planarization layer 113 (e.g., in the Z direction). The pixel electrode 210 may be a (semi-)transmissive electrode or a reflective electrode. In some exemplary embodiments, the pixel electrode 210 may include a reflective layer including argentum (Ag), magnesium (Mg), Al, platinum (Pt), palladium (Pd), aurum (Au), nickel (Ni), neodymium (Nd), iridium (Ir), chromium (Cr), and a compound thereof, and a transparent or semi-transparent electrode layer on the reflective layer. The transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). In some exemplary embodiments, the pixel electrode 210 may include a stack structure including ITO/Ag/ITO. However, exemplary embodiments of the present inventive concepts are not limited thereto.

A pixel defining layer 180 may be disposed on the second planarization layer 113. For example, a bottom surface of the pixel defining layer 180 may be disposed on a top surface of the second planarization layer (e.g., in the Z direction). The pixel defining layer 180 includes an opening that exposes a central portion (e.g., in the X direction) of the pixel electrode 210 to define a light-emitting region of a pixel. The pixel defining layer 180 also increases a distance between an edge of the pixel electrode 210 and an opposite electrode 230 on the pixel electrode 210 to prevent the generation of an arc at the edge of the pixel electrode 210. In an exemplary embodiment, the pixel defining layer 180 may include, for example, an organic insulating material such as polyimide, polyamide, an acrylic resin, BCB, HMDSO, and a phenol resin, and may be obtained by a spin coating, etc. However, exemplary embodiments of the present inventive concepts are not limited thereto. In an exemplary embodiment, the pixel defining layer 180 may include the same material as the material of the first layer 181 that will be described later.

A spacer 190 may be disposed on the pixel defining layer 180. For example, a bottom surface of the spacer 190 may be disposed on atop surface of the pixel defining layer 180 (e.g., in the Z direction). The spacer 190 may prevent damage to the organic light-emitting diode OLED due to sagging of a mask in a manufacturing process in which the mask is used. The spacer 190 may include, for example, an organic insulating material such as polyimide, polyamide, an acrylic resin, BCB, HMDSO, and a phenol resin, and may be obtained by spin coating, etc. However, exemplary embodiments of the present inventive concepts are not limited thereto. In addition, the spacer 190 may have a single-layered or multi-layered structure. In an exemplary embodiment, the spacer 190 may include the same material as the material included in the second layer 191 that will be described later.

The intermediate layer 220 may be disposed on the portion of the pixel electrode 210 that is exposed by the pixel defining layer 180. The intermediate layer 220 may include a light-emitting layer, and functional layers such as a hole transport layer (HTL), a hole injection layer (HIL), an electron transport layer (ETL), and an electron injection layer (EIL) may be selectively arranged under and on the light-emitting layer.

The light-emitting layer may include an organic material including a fluorescent or phosphor material emitting red, green, blue, or white light. The light-emitting layer may include low-molecular weight organic materials or polymer materials. However, exemplary embodiments of the present inventive concepts are not limited thereto.

In embodiments in which the light-emitting layer includes a low-molecular weight material, the intermediate layer 220 may include a hole injection layer (HIL), a hole transport layer (HTL), an emission layer (EML), an electron transport layer (ETL), and an electron injection layer (EIL) in a single or multiple-layered structure. For example, the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$). The above layers may be manufactured by a vacuum deposition method. However, exemplary embodiments of the present inventive concepts are not limited thereto.

In exemplary embodiments in which the light-emitting layer includes a polymer material, the intermediate layer 220 may include an HTL and an EML. The HTL may include poly(3,4-ethylenedioxythiophene) PEDOT, and the EML may include a poly-phenylenevinylene (PPV)-based or polyfluorene-based polymer material. The light-emitting layer may be arranged by using a screen printing method, an inkjet printing method, a laser induced thermal imaging (LITI) method, etc.

A plurality of pixel electrodes 210 may be arranged and the intermediate layer 220 may correspond (e.g., overlap in the Z direction) to each of the plurality of pixel electrodes 210. However, exemplary embodiments of the present inventive concepts are not limited thereto. The intermediate layer 220 may be variously modified, that is, may be arranged throughout the plurality of pixel electrodes 210. In an exemplary embodiment, the intermediate layer 220 may correspond to each of the plurality of pixel electrodes 210, and functional layer(s) except the intermediate layer 220 may be provided integrally throughout the plurality of pixel electrodes 210.

The opposite electrode 230 may be disposed on the intermediate layer 220 (e.g., in the Z direction). For example, the opposite electrode 230 may entirely cover the intermediate layer 220. In an exemplary embodiment, the opposite electrode 230 is arranged above the display area DA and may extend (e.g., in the X direction) on an entire surface of the display area DA. For example, the opposite electrode 230 may be integrally formed to cover a plurality of pixels. The opposite electrode 230 may electrically contact a conductive layer 75 on the non-display area NDA. In an exemplary embodiment, the opposite electrode 230 may extend to a region adjacent to the first barrier wall PW1 as shown in FIG. 7.

In an exemplary embodiment, the opposite electrode 230 may be a transmissive electrode or a reflective electrode. In some exemplary embodiments, the opposite electrode 230 may be a transparent or a semi-transparent electrode, and may be provided as a metal thin film including Li, Ca, LiF/Ca, LiF/Al, Al, Ag, Mg, and a compound thereof having a small work function. Also, a transparent conductive oxide (TCO) such as ITO, IZO, ZnO, or $In_2O_3$ may be further provided over the metal thin film. However, exemplary embodiments of the present inventive concepts are not limited thereto.

In embodiments in which the pixel electrode 210 is a reflective electrode and the opposite electrode 230 is a transmissive electrode, light emitted from the intermediate layer 220 is emitted towards the opposite electrode 230 and the display apparatus 1 is a top emission type. In another exemplary embodiment in which the pixel electrode 210 includes a transparent or a semi-transparent electrode and the opposite electrode 230 includes a reflective electrode, the light emitted from the intermediate layer 220 is discharged towards the substrate 100 and the display apparatus 1 may be a bottom emission type. However, exemplary embodiments of the present inventive concepts are not limited thereto. For example, the display apparatus 1 according to an exemplary embodiment may be a dual-emission type that emits light towards both the front and back surfaces.

The thin film encapsulation layer 300 is disposed on the opposite electrode 230 to protect the organic light-emitting diode OLED against the external moisture and oxygen. In an exemplary embodiment the thin film encapsulation layer 300 may include at least one organic encapsulation layer and at least one inorganic encapsulation layer. The thin film encapsulation layer 300 covers the entire portion of the display area DA and extends (e.g., in the X direction) to the non-display area NDA to partially cover the non-display area NDA. The thin film encapsulation layer 300 may extend to an outer side of a third barrier wall PW3 (e.g., the lateral side of the third barrier wall that is farthest away from the display area DA in the X direction).

The thin film encapsulation layer 300 may include a first inorganic encapsulation layer 310. For example, a bottom surface of the first inorganic encapsulation layer 310 may be disposed directly on a top surface of the opposite electrode 230 (e.g., in the Z direction). A second inorganic encapsulation layer 330 is disposed above the first inorganic encapsulation layer 310 (e.g., in the Z direction). An organic encapsulation layer 320 is disposed between the first inorganic encapsulation layer 310 and the second inorganic encapsulation layer 330 (e.g., in the Z direction). For example, a bottom surface of the organic encapsulation layer 320 may be disposed directly on a top surface of the first inorganic encapsulation layer 310 (e.g., in the Z direction). A bottom surface of the second inorganic encapsulation layer 330 may be disposed directly on a top surface of the organic encapsulation layer 320 (e.g., in the Z direction).

In this embodiment, the first inorganic encapsulation layer 310 and the second inorganic encapsulation layer 330 in the thin film encapsulation layer 300 may extend to the outer side of the third barrier wall PW3. However, the organic encapsulation layer 320 in the thin film encapsulation layer 300 may not extend to the outer side of the third barrier wall PW3 and may terminate in a region that is closer to the display area DA (e.g., in the X direction) than an inner side of the second barrier wall PW2. The first inorganic encapsulation layer 310 and the second inorganic encapsulation layer 330 may be in direct contact with each other in a region between the first barrier wall PW1 and the second barrier wall PW2. For example, as shown in the exemplary embodiment of FIG. 7, the first inorganic encapsulation layer 310 and the second inorganic encapsulation layer 330 may be in direct contact with each other in a region between the termination of the organic encapsulation layer 320 and the inner side of the second barrier wall PW2.

The first and second inorganic encapsulation layers 310 and 330 may include one or more inorganic materials selected from aluminum oxide, titanium oxide, tantalum oxide, hafnium oxide, zinc oxide, silicon oxide, silicon nitride, and silicon oxynitride. However, exemplary embodiments of the present inventive concepts are not limited thereto. The first inorganic encapsulation layer 310 and the second inorganic encapsulation layer 330 may each have a single-layered structure or a multi-layered structure including the above-mentioned materials. The first inorganic encapsulation layer 310 and the second inorganic encapsulation layer 330 may include the same material as each other or different materials from each other.

In an exemplary embodiment, the first inorganic encapsulation layer 310 and the second inorganic encapsulation layer 330 may have different thicknesses (e.g., length between a bottom surface and top surface in the Z direction). The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310. However, in other exemplary embodiments, the first inorganic encapsulation layer 310 and the second inorganic encapsulation layer 330 may have the same thickness.

In exemplary embodiments, the organic encapsulation layer 320 may include a monomer-based material or a polymer-based material. For example, the organic encapsulation layer 320 may include polyethylene terephthalate, polyethylene naphthalate, polycarbonate, polyimide, polyethylene sulfonate, polyoxymethylene, polyarylate, hexamethyl disiloxane, an acryl-based resin (e.g., polymethyl methacrylate polyacrylic acid, etc.), or a combination thereof. However, exemplary embodiments of the present inventive concepts are not limited thereto.

As shown in the exemplary embodiment of FIG. 7, a plurality of dummy pixels DPX may be arranged in the non-display area NDA adjacent to the light-emitting device 200. For example, as shown in the exemplary embodiment of FIG. 7, the plurality of dummy pixels DPX may be disposed in the non-display area NDA adjacent to the light-emitting device in the X direction. The dummy pixels DPX are not configured to emit light. The dummy pixels DPX may include, for example, a patterned intermediate layer. The dummy pixels DPX may be disposed between the display area DA and a driving circuit area DPC-A.

The driving circuit area DPC-A may be disposed on the non-display area NDA. For example, a first scan driving circuit 110 may be positioned in the driving circuit area DPC-A. The first scan driving circuit 110 includes thin film transistors TFT-P and wirings connected to the thin film transistors. In an exemplary embodiment, the thin film transistor TFT-P may be manufactured through the same manufacturing process of the dun film transistor TFT of the pixel circuit PC.

The buffer layer 101, the gate insulating layer 103, the first interlayer insulating layer 105, the second interlayer insulating layer 107, and the protective layer 109 may extend to the non-display area NDA (e.g., in the X direction). The buffer layer 101, the gate insulating layer 103, the first interlayer insulating layer 105, the second interlayer insulating layer 107, and the protective layer 109 may include an inorganic insulating material. The first planarization layer 111, the second planarization layer 113, and the pixel defining layer 180 may also extend to the non-display area NDA (e.g., in the X direction). The first planarization layer 111, the second planarization layer 113, and the pixel defining layer 180 may include an organic insulating material.

The first scan driving circuit 110 may be covered by the protective layer 109. The protective layer 109 may prevent wirings that include metal such as aluminum, which may be damaged by an etchant, from being exposed to an etching environment during processes of manufacturing the display apparatus 1. FIG. 7 shows that the protective layer 109 may be also disposed on the display area DA.

In an exemplary embodiment, the protective layer 109 may include an inorganic material, such as SiOx, SiNx, and/or SiON, aid may have a single-layered or multi-layered structure. In an exemplary embodiment, the protective layer 109 may include SiNx. The protective layer 109 may have a thickness of about 500 Å to about 10,000 Å. However, exemplary embodiments of the present inventive concepts are not limited thereto.

An insulating layer ILL may be disposed on the protective layer 109 in the non-display area NDA. For example, a bottom surface of the insulating layer ILL may be disposed directly on a top surface of the protective layer 109 (e.g. in the Z direction). The insulating layer ILL may include a first insulating layer ILL1, a second insulating layer ILL2, and a third insulating layer ILL3. As shown in the exemplary embodiment of FIG. 7, a bottom surface of the second insulating layer ILL2 may be disposed directly on a top surface of the first insulating layer ILL1 (e.g., in the Z direction). The third insulating layer ILL3 may be disposed above the second insulating layer ILL2 (e.g., in the Z direction). The conductive layer 75 may be disposed between the second insulating layer ILL2 and the third insulating layer ILL3. For example, a bottom surface of the conductive layer 75 may directly contact a top surface of the second insulating layer ILL2 (e.g., in the Z direction). A top surface of the conductive layer 75 may directly contact a bottom surface of the third insulating layer ILL3 (e.g., in the Z direction).

In an exemplary embodiment, the first insulating layer ILL1 may be an extending portion of the first planarization layer 111 on the display area DA that extends (e.g., in the X direction) into the non-display area NDA. The second insulating layer ILL2 may be an extending portion of the second planarization layer 113 on the display area DA that extends (e.g., in the X direction) into the non-display area NDA. The third insulating layer ILL3 may be an extending portion of the pixel defining layer 180 on the display area DA that extends (e.g., in the X direction) into the non-display area NDA. Therefore, the first insulating layer ILL1 may include the same material as the material of the first planarization layer 111, the second insulating layer ILL2 may include the same material as the material of the second planarization layer 113, and the third insulating layer ILL3 may include the same material as rite material of the pixel defining layer 180.

The insulating layer ILL may include an organic insulating material, and thus the insulating layer ILL may be vulnerable to external moisture infiltration. Therefore, in an alternative embodiment, the first insulating layer ILL1, the second insulating layer ILL2, and the third insulating layer ILL3 in the insulating layer ILL may be partially removed to form a valley portion.

The first barrier wall PW1, the second barrier wall PW2, and the third barrier wall PW3 may be disposed on the substrate 100 in the non-display area NDA. The first barrier wall PW1 may be arranged along a periphery of the display area DA on the non-display area NDA. The second barrier wall PW2 may be arranged along the periphery of the display area DA and may be spaced apart from the first barrier wall PW1. For example, the second barrier wall PW2 may be disposed farther from the display area DA thin the first barrier wall PW1 and may be spaced apart from the first barrier wall in the X direction. The third barrier wall PW3 may be arranged farther from the display area DA than the first barrier wall PW1 and the second barrier wall PW2 and may be spaced apart from the first barrier wall and second barrier wall in the X direction.

The second power supply line 170 may be disposed on the substrate 100 in the non-display area NDA. The second power supply line 170 may provide the second power voltage ELVSS to the opposite electrode 230 of each pixel P.

A second connecting line 171 may be disposed on the second power supply line 170. For example, a bottom surface of the second connecting line 171 may directly contact a top surface of the second power supply line 170 (e.g., in the Z direction). The second power supply line 170 is connected to the conductive layer 75 via the second connecting line 171 to provide the opposite electrode 230 with the second power voltage ELVSS.

An end portion 75A of the conductive layer 75 may be disposed between the first barrier wall PW1 and the second connecting line 171 (e.g., in the Z direction). The first barrier wall PW1 and an end portion ILL1A of the first insulating layer ILL1 may be arranged with the second connecting line 171 and the conductive layer 75 therebetween (e.g., in the Z direction).

The conductive layer 75 may be disposed on the second connecting line 171. For example, a bottom surface of the conductive layer 75 may be disposed on a surface of the second connecting line 171 (e.g., in the Z direction). The conductive layer 75 is in contact with the second connecting line 171 via the end portion 75A thereof to provide the second power voltage ELVSS to the opposite electrode 230.

The first barrier wall PW1 is arranged on the non-display area NDA along the periphery of the display area DA. The first barrier wall PW1 may include the first layer 181 and the second layer 191. The first layer 181 includes a first portion 1A having a first height h1 from an upper surface 100A of the substrate 100 (e.g., the length in the Z direction between a top surface of the first portion 1A of the first layer 181 and an upper surface 100A of the substrate). The first barrier wall PW1 also includes a second portion 2A having a second height h2 from the upper surface 100A of the substrate 100 (e.g., the length in the Z direction between a top surface of the second portion 2A of the first layer 181 and an upper surface 100A of the substrate). As shown in the exemplary embodiment of FIG. 7, the second height h2 of the second portion 2A of the first layer 181 may be less than the first height h1 of the first portion 1A of the first layer. The second layer 191 is disposed on the second portion 2A of the first layer 181. For example, a bottom surface of the second layer 191 may be disposed directly on a top surface of the second portion 2A of the first layer 181 (e.g., in the Z direction).

The first layer 181 of the first barrier wall PW1 may be disposed on the substrate 100, overlapping at least partially (e.g., in the Z direction) the first insulating layer ILL1 and the second insulating layer ILL2 of the insulating layer ILL. For example, the first barrier wall PW1 and the end portion ILL1A of the first insulating layer ILL1 may be arranged with the second connecting line 171 and the conductive layer 75 therebetween (e.g., in the Z direction), and the first barrier wall PW1 and an end portion ILL2A of the second insulating layer ILL2 may be arranged with the conductive layer 75 therebetween (e.g., in the Z direction). The first barrier wall PW1 may partially overlap (e.g., in the Z direction) the end portion ILL1A of the first insulating layer ILL1 and the end portion ILL2A of the second insulating layer ILL2.

In the first barrier wall PW1, the second portion 2A may not overlap the end portion ILL1A of the first insulating layer ILL1 (e.g., in the Z direction) and the end portion ILL2A of the second insulating layer ILL2 may have a height from the upper surface 100A of the substrate 100 that is less than the height of the upper surface of the first portion 1A that overlaps the end portion ILL1A and the end portion ILL2A. Therefore, the second layer 191 is provided on the second portion 2A having a smaller height than the first portion 1A to compensate for the height difference and to planarize an upper surface of the first barrier wall PW1. Therefore, a first signal line 450 and a second signal line 460 that will be described later in FIG. 12 may be stably disposed on the thin film encapsulation layer 300.

Therefore, the inclusion of the second layer 191 compensates for the height difference between the first portion 1A and the second portion 2A of the first barrier wall PW1 and increases an area of an upper surface of the first barrier wall PW1 which the thin film encapsulation layer 300 is disposed thereon. For example, the thickness of the second layer 191 (e.g., length in the Z direction between a top surface and bottom surface) may be approximately equal to the difference between the first height h1 of the first portion 1A and the second height h2 of the second portion 1B. Therefore, the organic material forming the organic encapsulation layer 320 may be deposited on the first barrier wall PW1 to a constant thickness.

In an exemplary embodiment, the first layer 181 may include the same material as the material of the third insulating layer ILL3 and the pixel defining layer 180 on the display area DA, and the second layer 101 may include the same material as the material of the spacer 190 on the display area DA.

The second barrier wall PW2 may be disposed on the second power supply line 170 and the second connecting line 171 may be disposed on the second power supply line 170. For example, as shown in the exemplary embodiment of FIG. 7, a bottom surface of the second connecting line 171 may be disposed on a top surface of the second power supply line 170 (e.g., in the Z direction). A bottom surface of the second barrier wall PW2 may be disposed on a top surface of the second connecting line 171 (e.g., in the Z direction).

The third barrier wall PW3 may at least partially overlap an outer end portion of the second power supply line 170 (e.g., a lateral end portion of the second power supply line farthest from the display area DA in the X direction).

The first barrier wall PW1, the second barrier wall PW2, and the third barrier wall PW3 may prevent overflow of the organic material forming the organic encapsulation layer 320 to the outer side of the substrate 100.

Figure 8:
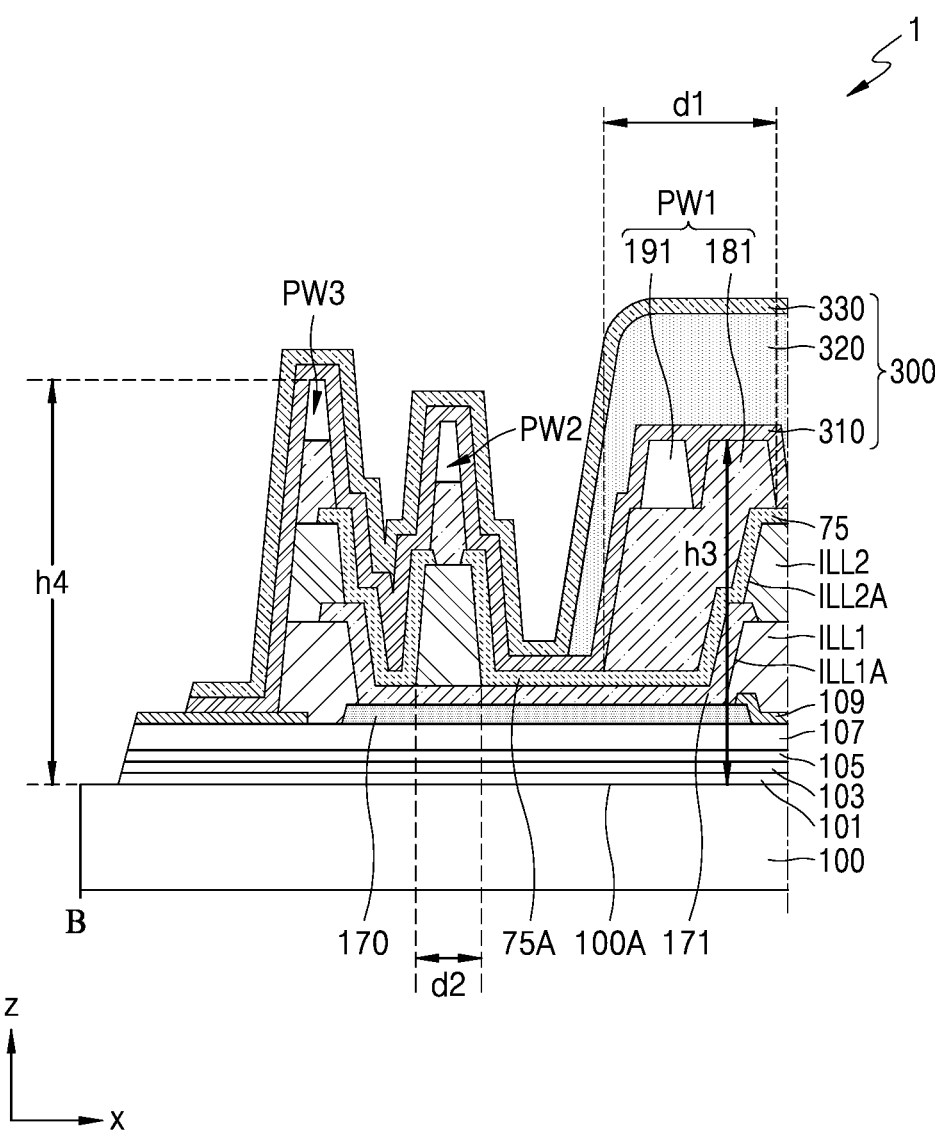
FIG. 8 is an enlarged view of a first barrier wall, a second barrier wall, and a third barrier wall in the display apparatus of FIG. 7 according to an exemplary embodiment of the present inventive concepts.
Figure 9:
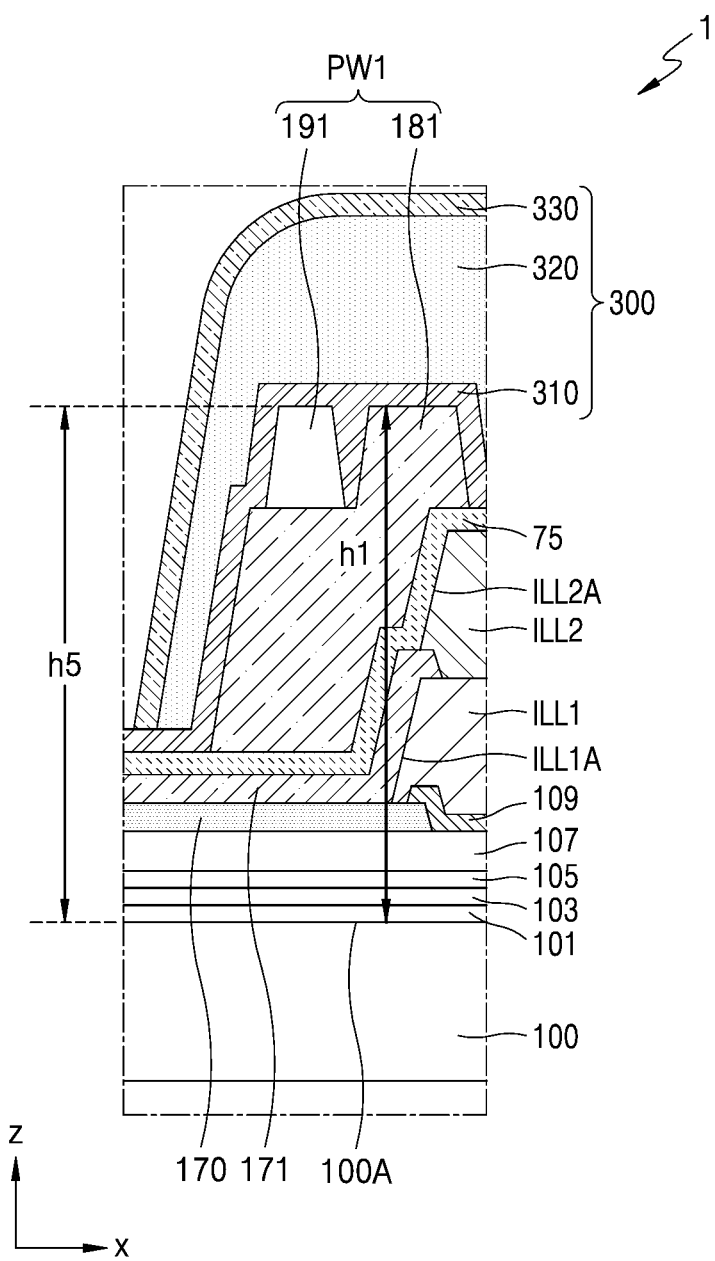
FIG. 9 is an enlarged view of a first barrier wall in the display apparatus of FIG. 7 according to an exemplary embodiment of the present inventive concepts.

FIG. 8 is an enlarged view of the first barrier wall PW1, the second barrier wall PW2, and the third barrier wall PW3 in the display apparatus 1 of FIG. 7. FIG. 9 is an enlarged view of the first barrier wall PW1 in the display apparatus 1 of FIG. 7.

Referring to FIG. 8, the first barrier wall PW1 may have a first width d1 (e.g., length in the X direction) and the second barrier wall PW2 may have a second width d2 (e.g., length in the X direction) that is less than the first width d1.

Figure 12:
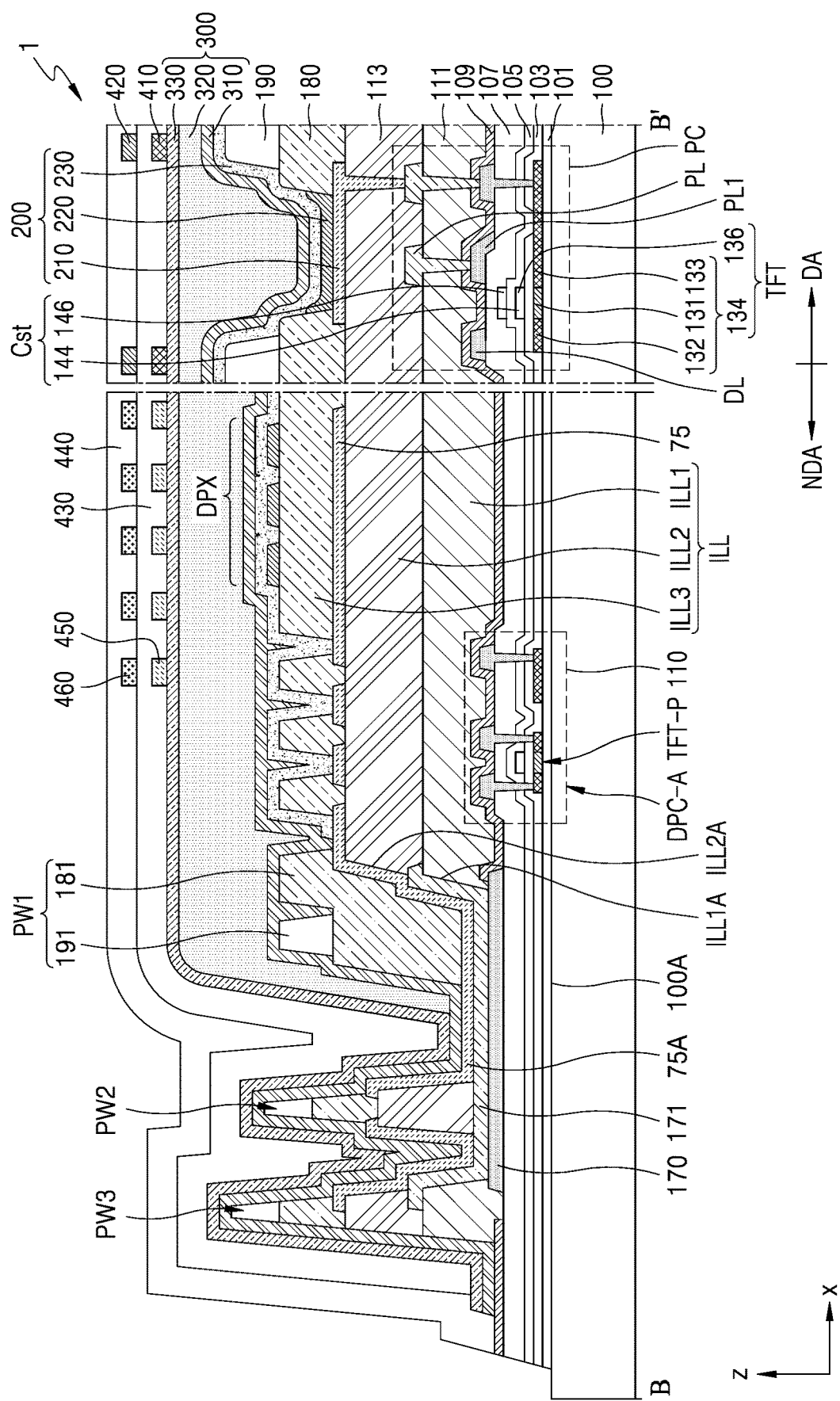
FIG. 12 is a cross-sectional view of a display apparatus according to an exemplary embodiment of the present inventive concepts.

The first barrier wall PW1 is wider than the second barrier wall PW2 to increase an amount of the organic material reflowed on the first barrier wall PW1 and to arrange the organic encapsulation layer 320 to a certain thickness or greater on the first barrier wall PW1. Therefore, the first signal line 450 and the second signal line 460 may be stably disposed on the thin film encapsulation layer 300 as shown in FIG. 12 herein.

The first barrier wall PW1 may have a third height h3 (e.g., the length in the Z direction between a top surface of the first barrier wall PW1 and an upper surface 100A of the substrate). For example, as shown in the exemplary embodiment of FIG. 8, the third height h3 may be equal to the height of the second layer 191 and first portion 1A of the first layer in FIG. 7. The third barrier wall PW3 may have a fourth height h4 from the upper surface 100A of the substrate 100 (e.g., the length in the Z direction between a top surface of the third barrier wall PW3 and an upper surface 100A of the substrate). The fourth height h4 is greater than the third height h3.

In the non-display area NDA, the first barrier wall PW1 is lower than the third barrier wall PW3 to prevent damage to the first barrier wall PW1 due to a mask dent that may occur during the manufacturing processes.

Referring to FIG. 9, in the display apparatus 1 according to the exemplary embodiment, an upper surface of the first layer 181 in the first portion 1A of the first barrier wall PW1 may have the first height h1 from the upper surface 100A of the substrate 100 and an upper surface of the second layer 191 in the second portion 2A way have a fifth height h5 from the upper surface 100A of the substrate 100. In an exemplary embodiment, the fifth height h5 may be equal to or less than the first height h1 of the first barrier wall PW1.

The second layer 191 that is disposed on the second portion 2A planarizes the upper surface of the first barrier wall PW1. As shown in the exemplary embodiments of FIGS. 7-9, the second layer 191 may be disposed directly on the top surface of the second portion 2A (e.g., in the Z direction) to compensate for the height difference between the first and second portions 1A and 2A. Therefore, the organic encapsulation layer 320 may be stably arranged on the first barrier wall PW1, and the first signal line 450 and the second signal line 350 that will be described later may be stably arranged on the thin film encapsulation layer 300.

Figure 10:
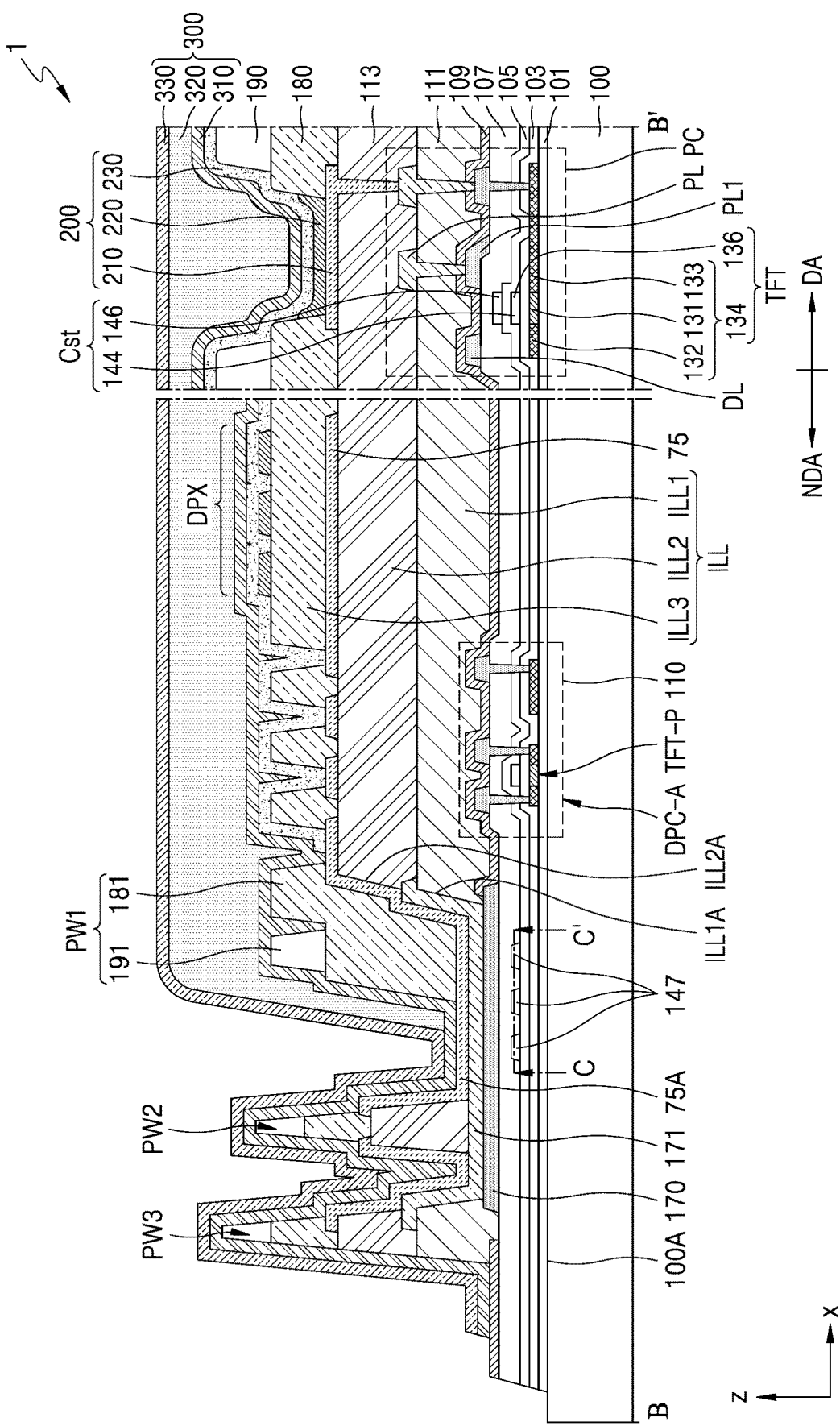
FIG. 10 is a cross-sectional view showing a portion of a display apparatus taken along line B-B' of FIG. 3 according to another exemplary embodiment of the present inventive concepts.
Figure 11:
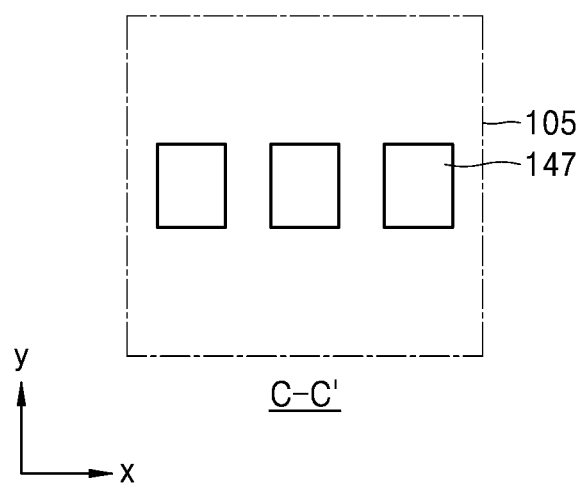
FIG. 11 is a cross-sectional view taken along line C-C of FIG. 10 according to an exemplary embodiment of the present inventive concepts.

FIG. 10 is a cross-sectional view partially showing a display apparatus according to an exemplary embodiment taken along line B-B' of FIG. 3. FIG. 11 is a cross-sectional view taken along line C-C' of FIG. 10.

Referring to FIGS. 10 and 11, the display apparatus 1 according to an exemplary embodiment of the present inventive concepts may further include a metal pattern layer 147 that is disposed on the substrate 100 to correspond to at least a part of the first barrier wall PW1. For example, a portion of the metal pattern layer 147 may overlap the first barrier wall PW1 in the Z direction.

The metal pattern layer 147 is disposed on the first interlayer insulating layer 105 to function as a vernier key for identifying whether the organic encapsulation layer 320 is arranged on the first barrier wall PW1 in the manufacturing processes. In more detail, it may be identified whether the organic encapsulation layer 320 is formed on the first barrier wall PW1 to a certain thickness or greater by using the metal pattern layer 147.

The metal pattern layer 147 has an embossed structure having protrusions and/or indentations, and three metal pattern layers may be disposed on the substrate 100 to at least partially correspond (e.g., overlap in the Z direction) to the first barrier wall PW1. FIGS. 10 and 11 show that the three metal pattern layers are disposed on the substrate 100 to at least partially correspond to the first barrier wall PW1. However, exemplary embodiments of the present inventive concepts are not limited thereto.

Also, in the exemplary embodiments shown in FIGS. 10 and 11, the metal pattern layers 147 are disposed directly on the first interlayer insulating layer 105. For example, the bottom surface of the metal pattern layers 147 directly contact a top surface of the first interlayer insulating layer 105 (e.g., in the Z direction). However, in other exemplary embodiments the metal pattern layers 147 may be disposed directly on the second interlayer insulating layer 107 or the gate insulating layer 103.

Moreover, in FIG. 10, the metal pattern layers 147 are arranged based on the external end of the first barrier wall PW1. However, in other exemplary embodiments, the metal pattern layers 147 may be arranged inside the first barrier wall PW1 (e.g., closer to the display area DA in the x direction than an inner side of the first barrier wall PW1) or on the outer side of the first barrier wall PW1 (e.g., farther from the display area DA in the X direction than an outer side of the first barrier wall PW1). In an exemplary embodiment, the metal pattern layers 147 may include the same material as the material of the upper electrode 146 on the display area DA and may be arranged by the same process.

FIG. 12 is a cross-sectional view of a display apparatus according to an exemplary embodiment of the present inventive concepts.

Referring to FIG. 12, the display apparatus 1 according to an exemplary embodiment may further include the touch unit TU disposed on the second inorganic encapsulation layer 330. For example, a bottom surface of the touch unit TU may be disposed directly on a top surface of the second inorganic encapsulation layer (e.g., in the Z direction)

As shown in FIG. 6, the touch unit TU may include a sensing electrode corresponding to the display area DA and a signal line corresponding to the non-display area NDA and being connected to the sensing electrode.

The sensing electrode may include a first conductive layer 410, a second conductive layer 420 disposed above the first conductive layer 410, a first touch insulating layer 430 disposed between the first conductive layer 410 and the second conductive layer 420, and a second touch insulating layer 440 disposed on the second conductive layer 420. The sensing electrode including the metal layers may have a mesh shape to prevent the sensing electrode from being visible to the user. Also, as shown in the exemplary embodiment of FIG. 11, the sensing electrode may not be located on a region where the light-emitting device is arranged.

The signal line may include a first signal line 450, a second signal line 460 disposed on the first signal line 450 (e.g., in the Z direction) the first touch insulating layer 430 between the first signal line 450 and the second signal line 460 (e.g., in the Z direction), and the second touch insulating layer 440 on the second signal line 460 (e.g., in the Z direction).

The thin film encapsulation layer 300 has to be formed to a certain thickness or greater to ensure the sufficiency of the performance of the touch unit TU. However, in a barrier wall structure according to the related art, a thickness of the organic encapsulation layer 320 in the thin film encapsulation layer 300 is gradually reduced towards the outer portion of the non-display area NDA due to a low viscosity of the organic material. Therefore, a disconnection may occur in the touch wirings included in the touch unit TU or a touching performance may degrade.

Therefore, according to one or more exemplary embodiments of the present inventive concepts, the first barrier wall PW1 is arranged widely to the outer portion of the non-display area NDA and a second layer 191 is arranged or a region having a lower height since there is no insulating layer in the first barrier wall PW1 to maintain the height of the first barrier wall PW1. Therefore, the organic material in the organic encapsulation layer 320 may be deposited to a constant thickness under the touch wirings of the touch unit TU. Accordingly, disconnection of the touch wirings or degradation in the performance of the touch unit may be prevented.

According to one or more exemplary embodiments, to address issues such as display defects because a structure for preventing moisture infiltration is not provided on the outer portion of the panel in the display apparatus according to the related art, the first barrier wall PW1 is widely arranged to the outer portion of the non-display area NDA so that the organic material may be deposited to a certain thickness or greater under the touch wirings and the reliability may be improved.

While the display apparatus has been described with respect to the exemplary embodiments, exemplary embodiments of the present inventive concepts are not limited thereto. For example, a method of manufacturing the display apparatus may be also included in the scope of the disclosure.

According to one or more exemplary embodiments, the display apparatus having improved reliability may be implemented by arranging a structure for preventing moisture infiltration from the outside to a certain thickness on the non-display area. However, exemplary embodiments of the present inventive concepts are not limited thereto.

It should be understood that exemplary embodiments of the present inventive concepts described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
 a substrate comprising a display area and a non-display area on a periphery of the display area;
 a display device on the display area, the display device comprising a light-emitting device electrically connected to a thin film transistor; and
 a first barrier wall on the non-display area, the first barrier wall surrounding the display area and comprising a first layer and a second layer;
 wherein the first layer comprises a first portion having a first height from an upper surface of the substrate, and a second portion having a second height from the upper surface of the substrate that is less than the first height; and
 wherein the second layer is on the second portion.

2. The display apparatus of claim 1, further comprising:
 a metal pattern layer disposed on the substrate, the metal pattern layer at least partially overlapping the first barrier wall.

3. The display apparatus of claim 2, wherein the metal pattern layer has an embossed structure.

4. The display apparatus of claim 2, wherein:
 the display device further comprises a first planarization layer on the thin film transistor and a pixel defining layer on the first planarization layer, wherein the first planarization layer covers the thin film transistor and the pixel defining layer comprises an opening that defines a light-emitting region of the light-emitting device, and
 the first layer comprises a same material as a material in the pixel defining layer.

5. The display apparatus of claim 4, wherein the display device further comprises a spacer on the pixel defining layer and the second layer comprises a same material as a material in the spacer.

6. The display apparatus of claim 4, wherein:
 the display device further comprises a storage capacitor comprising a lower electrode and an upper electrode that overlaps the lower electrode,
 the thin film transistor comprises an active layer and a gate electrode, and
 the metal pattern layer comprises a same material as a material in the upper electrode.

7. The display apparatus of claim 6, wherein the lower electrode and the gate electrode are integral with each other.

8. The display apparatus of claim 4, wherein the first planarization layer extends towards the non-display area and comprises a first insulating layer in the non-display area.

9. The display apparatus of claim 8, wherein the first barrier wall is on the non-display display area along a periphery of the display area and at least partially overlaps the first insulating layer.

10. The display apparatus of claim 1, further comprising:
 a second barrier wall arranged along a periphery of the display area, the second barrier wall spaced apart from the first barrier wall; and
 a third barrier wall arranged along the periphery of the display area, the third barrier wall spaced apart from the second barrier wall.

11. The display apparatus of claim 10, wherein:
 the first barrier wall has a first width in a first direction that is parallel to the upper surface of the substrate and the second barrier will has a second width in the first direction that is less than the first width.

12. The display apparatus of claim 10, wherein:
 a top surface of the first barrier wall has a third height from the upper surface of the substrate and the third barrier wall has a fourth height from the upper surface of the substrate that is greater than the third height.

13. The display apparatus of claim 10, further comprising a thin film encapsulation layer between the display device and the first barrier wall.

14. The display apparatus of claim 13, wherein:
 the thin film encapsulation layer comprises a first inorganic encapsulation layer;
 a second inorganic encapsulation layer above the first inorganic encapsulation layer; and
 an organic encapsulation layer between the first inorganic encapsulation layer and the second inorganic encapsulation layer.

15. The display apparatus of claim 14, wherein the first inorganic encapsulation layer and the second inorganic encapsulation layer contact each other in a region between the first barrier wall and the second barrier wall.

16. The display apparatus of claim 14, further comprising:
 a touch unit directly on the second inorganic encapsulation layer,
 wherein the touch unit comprises:
 a sensing electrode in the display area; and
 a signal line in the non-display area, the signal line is connected to the sensing electrode.

17. The display apparatus of claim 16, wherein the sensing electrode comprises:
 a first conductive layer;
 a second conductive layer above the first conductive layer;
 a first touch insulating layer between the first conductive layer and the second conductive layer; and
 a second touch insulating layer on the second conductive layer.

18. The display apparatus of claim 17, wherein the sensing electrode has a mesh shape.

19. The display apparatus of claim 1, wherein an upper surface of the second layer has a fifth height from the upper surface of the substrate that is equal to or less than the first height.

20. A display apparatus comprising:
 a substrate comprising a display area and a non-display area on a periphery of the display area;
 a display device on the display area, the display device comprising a light-emitting device electrically connected to a thin film transistor;
 a first barrier wall on the non-display area along a periphery of the display area, the first barrier wall comprising a first layer and a second layer, wherein the first layer comprises a first portion having a first height from an upper surface of the substrate and a second portion having a second height from the upper surface of the substrate that is less than the first height, and the second layer is on the second portion; and
 a metal pattern layer above the substrate, the metal pattern layer at least partially overlapping the first barrier wall on the non-display area.

* * * * *